US012690465B2

(12) United States Patent
Kuo et al.

(10) Patent No.: US 12,690,465 B2
(45) Date of Patent: Jul. 21, 2026

(54) PACKAGE STRUCTURE AND METHOD OF FABRICATING THE SAME

(71) Applicant: Taiwan Semiconductor Manufacturing Company, Ltd., Hsinchu (TW)

(72) Inventors: Cheng-Yu Kuo, Kaohsiung City (TW); Ching-Hua Hsieh, Hsinchu (TW); Chen-Hua Yu, Hsinchu City (TW); Chung-Shi Liu, Hsinchu City (TW); Yi-Yang Lei, Taichung City (TW); Wei-Jie Huang, New Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 720 days.

(21) Appl. No.: 18/079,905

(22) Filed: Dec. 13, 2022

(65) Prior Publication Data

US 2023/0115449 A1 Apr. 13, 2023

Related U.S. Application Data

(63) Continuation of application No. 17/120,276, filed on Dec. 14, 2020, now Pat. No. 11,569,183, which is a (Continued)

(51) Int. Cl.
*H01L 23/66* (2006.01)
*H01Q 1/22* (2006.01)
(Continued)

(52) U.S. Cl.
CPC .......... *H10W 44/20* (2026.01); *H01Q 1/2283* (2013.01); *H10W 42/121* (2026.01);
(Continued)

(58) Field of Classification Search
CPC . H01L 23/66; H01L 21/4853; H01L 21/4857; H01L 21/565; H01L 21/568;
(Continued)

(56) References Cited

U.S. PATENT DOCUMENTS 5,866,025 A * 2/1999 Kataoka .................. B29C 33/40
249/115
9,000,584 B2 4/2015 Lin et al.
(Continued)

*Primary Examiner* — Victor A Mandala
*Assistant Examiner* — Colleen E Snow
(74) *Attorney, Agent, or Firm* — JCIPRNET

(57) ABSTRACT

A package structure includes a semiconductor die, an insulating encapsulant, a first redistribution layer, a second redistribution layer, antenna elements and a first insulating film. The insulating encapsulant is encapsulating the at least one semiconductor die, the insulating encapsulant has a first surface and a second surface opposite to the first surface. The first redistribution layer is disposed on the first surface of the insulating encapsulant. The second redistribution layer is disposed on the second surface of the insulating encapsulant. The antenna elements are located over the second redistribution layer. The first insulating film is disposed in between the second redistribution layer and the antenna elements, wherein the first insulating film comprises a resin rich region and a filler rich region, the resin rich region is located in between the filler rich region and the second redistribution layer and separating the filler rich region from the second redistribution layer.

20 Claims, 11 Drawing Sheets

Related U.S. Application Data continuation of application No. 16/441,029, filed on Jun. 14, 2019, now Pat. No. 10,867,939.

(60) Provisional application No. 62/771,588, filed on Nov. 27, 2018.

(51) Int. Cl.

| | |
|---|---|
| *H10W 42/00* | (2026.01) |
| *H10W 44/20* | (2026.01) |
| *H10W 70/05* | (2026.01) |
| *H10W 70/09* | (2026.01) |
| *H10W 70/60* | (2026.01) |
| *H10W 70/65* | (2026.01) |
| *H10W 70/685* | (2026.01) |
| *H10W 74/01* | (2026.01) |
| *H10W 74/10* | (2026.01) |
| *H10W 74/47* | (2026.01) |
| *H01Q 1/24* | (2006.01) |
| *H10W 70/652* | (2026.01) |

(52) U.S. Cl.

CPC ........... *H10W 70/05* (2026.01); *H10W 70/09* (2026.01); *H10W 70/093* (2026.01); *H10W 70/611* (2026.01); *H10W 70/614* (2026.01); *H10W 70/65* (2026.01); *H10W 70/685* (2026.01); *H10W 74/016* (2026.01); *H10W 74/019* (2026.01); *H10W 74/117* (2026.01); *H10W 74/473* (2026.01); *H01Q 1/243* (2013.01); *H10W 44/248* (2026.01); *H10W 70/6528* (2026.01)

(58) Field of Classification Search

CPC ............... H01L 23/295; H01L 23/3128; H01L 23/5383; H01L 23/5386; H01L 23/5389; H01L 23/562; H01L 24/19; H01L 24/20; H01Q 1/2283; H10W 44/20; H10W 74/019; H10W 70/685; H10W 70/093; H10W 70/65; H10W 70/614; H10W 70/05; H10W 70/09; H10W 70/611; H10W 74/473; H10W 74/016; H10W 74/117; H10W 42/121

See application file for complete search history.

(56) References Cited

U.S. PATENT DOCUMENTS

| | | | |
|---|---|---|---|
| 9,048,222 B2 | 6/2015 | Hung et al. | |
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2016/0093780 A1* | 3/2016 | Beppu | H01L 21/3213 |
| | | | 438/27 |
| 2019/0279935 A1* | 9/2019 | Unruh, Jr. | H01L 25/0655 |

* cited by examiner

Fx      Fx

Rx

Fx

102

104

IF      Rx

T1      104-Re(AL)

Fx
T2  Fx      104-Fi(RL)

Rx      102

PACKAGE STRUCTURE AND METHOD OF FABRICATING THE SAME

CROSS-REFERENCE TO RELATED APPLICATION

This application is a continuation application of U.S. application Ser. No. 17/120,276, filed on Dec. 14, 2020, now allowed. The prior application Ser. No. 17/120,276 is a continuation application of U.S. application Ser. No. 16/441, 029, filed on Jun. 14, 2019, which claims the priority benefit of U.S. provisional application Ser. No. 62/771,588, filed on Nov. 27, 2018. The entirety of each of the above-mentioned patent applications is hereby incorporated by reference herein and made a part of this specification.

BACKGROUND

Semiconductor devices and integrated circuits used in a variety of electronic applications, such as cell phones and other mobile electronic equipment, are typically manufactured on a single semiconductor wafer. The dies of the wafer may be processed and packaged with other semiconductor devices (e.g. antenna) or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
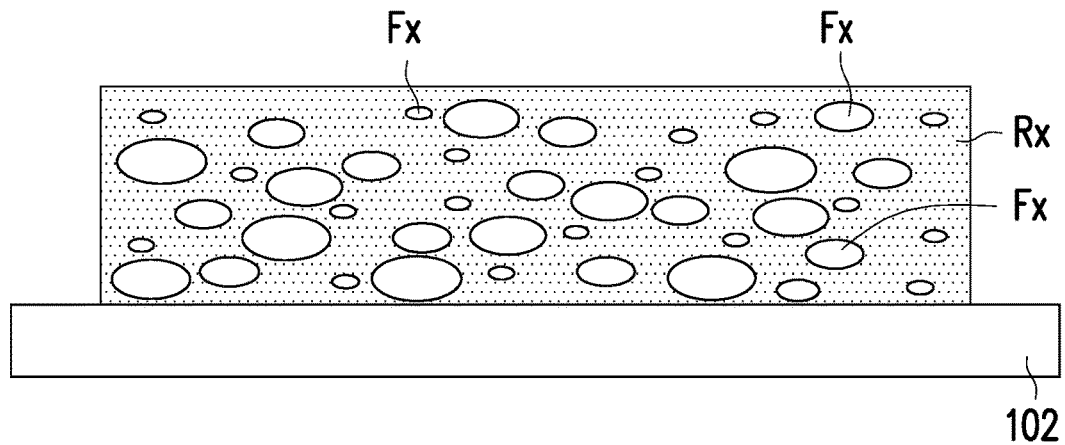
FIG. 1A to FIG. 1B are schematic sectional views of various stages in a method of fabricating an insulating film according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
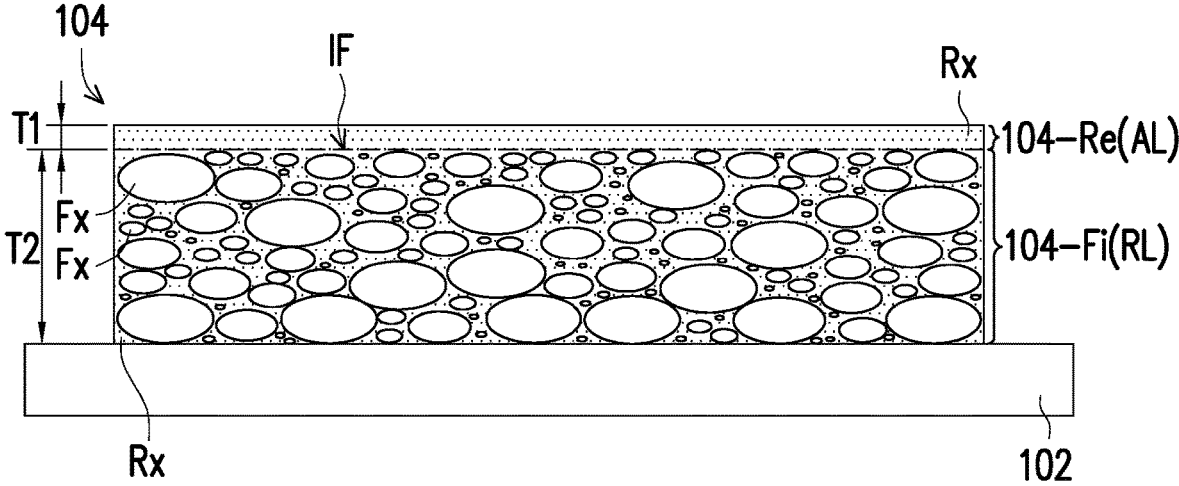

FIG. 1A to FIG. 1B are schematic sectional views of various stages in a method of fabricating an insulating film according to some exemplary embodiments of the present disclosure. Referring to FIG. 1A, a carrier or a support 102 is provided. The carrier or support 102 may be any type of carrier or support suitable for forming an insulating film thereon. In one embodiment, the support 102 includes a mold for accommodating and shaping. In some embodiments, a resin material Rx is provided on the support 102. The resin material Rx maybe include a base material that can be hardened when heated or cured. For example, the base material of the resin material Rx may be an epoxy resin-based adhesive material, an acrylic resin-based adhesive material, amine resin-based adhesive material or silicone resin-based material, but the disclosure is not limited thereto. In some embodiments, other types of adhesive materials may be suitably used as the resin material Rx. As illustrated in FIG. 1A, the resin material Rx includes a plurality of fillers Fx dispersed in the base material of the resin material Rx. The plurality of fillers Fx for example, may be inorganic particles such as silica particles, metal oxide particles such as $Al_2O_3$ particles, or the like, the disclosure is not limited thereto. The material and/or size of the fillers Fx may be selected based on mechanical properties or electrical properties of the product requirements. In some embodiments, the fillers Fx may be particles of spherical shapes, and may have a variety of sizes.

In one embodiment, by adding one or more solvent, a viscosity of the resin material Rx is adjusted or lowered. By adding an appropriate amount of the solvent or diluent, the viscosity of the resin material Rx becomes lowered so that the dispersed fillers Fx can be settled and clustered in one region or at one side of the resin material Rx to define a filler rich region 104-Fi. For example, when the viscosity becomes lower, the fillers Fx are settled at the lower side and gathered into a filler rich region 104-Fi through the action of the gravity, while the upper side with little or none fillers remaining becomes a resin rich region 104-Re. In some embodiments, the viscosity of the resin material Rx is in a range from 1 cP to 40000 cP. In some embodiments, the viscosity of the resin material Rx is adjusted or lowered to 3000 cP or less. In some embodiments, the viscosity of the resin material Rx is adjusted or lowered to a range of 10 cP to 1500 cP. In some embodiments, the viscosity of the resin material Rx is adjusted or lowered to a range of 10 cP to 500 cP. In one embodiment, the viscosity of the resin material Rx is adjusted with the aid of solvents. In some embodiments, the viscosity of the resin material Rx is adjusted with the aid of solvents, and further baking is performed to help in the sedimentation of the fillers Fx. In another embodiment, the viscosity of the resin material Rx is adjusted by using active diluents. In some other embodiments, in addition to adding more diluent, more fillers Fx may be added. However, the disclosure is not limited thereto, and other suitable methods may be applied to adjust the viscosity or to form the resin rich region.

Referring to FIG. 1B, after adjusting the viscosity and forming the resin rich region and the filler rich region in the resin material Rx, a curing process is performed to cure or harden the resin material Rx to form an insulating film 104. In the exemplary embodiment, the insulating film 104 contains the resin rich region 104-Re and the filler rich region 104-Fi, and an interface IF is located in between the resin rich region 104-Re and the filler rich region 104-Fi. In some embodiments, the filler rich region 104-Fi may constitute a resin layer RL, wherein the resin layer RL includes a plurality of fillers Fx. In certain embodiments, the resin rich region 104-Re may constitute an adhesive layer AL, wherein the adhesive layer AL is substantially filler free or includes very little fillers. For example, in one embodiment, a content of the fillers Fx located in the resin layer RL (filler rich region 104-Fi) is more than 80% by weight based on a total weight of the insulating film 104. In certain embodiments, a content of fillers Fx located in the adhesive layer AL (resin rich region 104-Re) is less than 10% by weight based on a total weight of the insulating film 104. In certain embodiments, a content of fillers Fx located in the adhesive layer AL (resin rich region 104-Re) is less than 5% by weight based on a total weight of the insulating film 104. In some other embodiments, a content of fillers Fx located in the adhesive layer AL (resin rich region 104-Re) is less than 1% by weight based on a total weight of the insulating film 104.

In the exemplary embodiment, the resin layer RL (filler rich region 104-Fi) and the adhesive layer AL (resin rich region 104-Re) are made of the same resin material Rx. Furthermore, in some embodiments, a ratio of a thickness T1 of the adhesive layer AL to a thickness T2 of the resin layer RL is in a range of 1:75 to 1:360. For example, in one embodiment, the thickness T1 of the adhesive layer AL (resin rich region 104-Re) is in a range of 0.5 μm to 2 μm. In certain embodiments, the thickness T2 of the resin layer RL (filler rich region 104-Fi) is in a range of 150 μm to 180 μm. By controlling the ratio of thicknesses (T1/T2) of the resin layer RL (filler rich region 104-Fi) and the adhesive layer AL (resin rich region 104-Re) in such a range, the adhesion strength of the insulating film 104 can be ensured. The insulating film 104 illustrated herein may be further peeled off or de-bonded from the support 102 and laminated onto other structures as required. Up to here, the preparation of an insulating film 104 according to some exemplary embodiments of the present disclosure is accomplished.

Figure 1C:
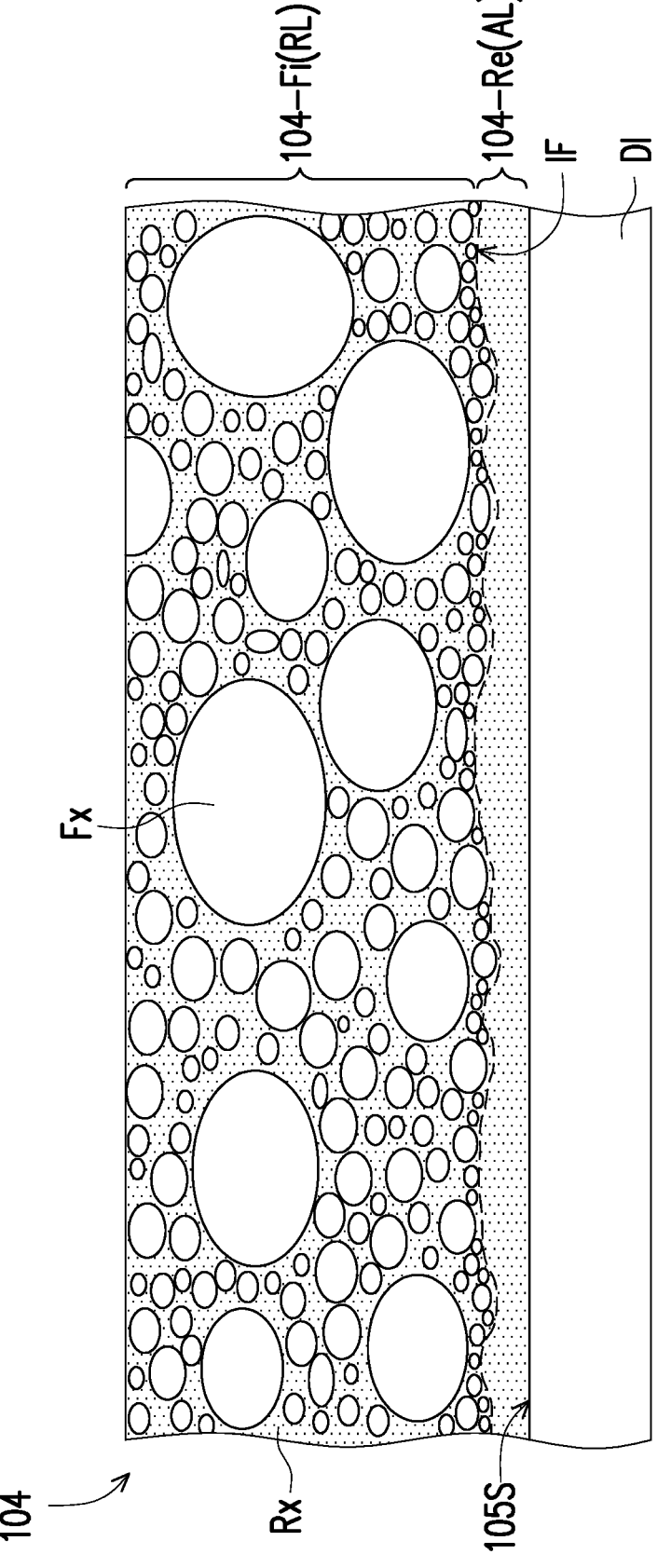
FIG. 1C is an enlarged view of an insulating film laminated on a dielectric layer according to some exemplary embodiments of the present disclosure.

FIG. 1C is an enlarged view of an insulating film 104 laminated on a dielectric layer DI according to some exemplary embodiments of the present disclosure. As illustrated in FIG. 1C, the insulating film 104 obtained in FIG. 1B may, for example, be laminated or attached onto a dielectric layer DI (or any other type of adherents). From the enlarged view shown in FIG. 1C, in some embodiments, the interface IF located in between the resin rich region 104-Re (adhesive layer AL) and the filler rich region 104-Fi (resin layer RL) is an uneven interface. For example, the profile of the interface IF located in between the resin rich region 104-Re and the filler rich region 104-Fi may be granular and gritty. In certain embodiments, the interface IF has a wave-like profile (uneven profile). In some embodiments, as the interface IF is defined along the surfaces of the stacked fillers Fx, the profile of the interface IF located in between the resin rich region 104-Re and the filler rich region 104-Fi is basically defined by the arrangement and configurations of fillers Fx located in the filler rich region 104-Fi (resin layer RL) and is rugged and uneven. In some embodiments, when compared with the interface IF, the bottom surface 105S of the insulating film 104 is a relatively smooth surface. That is, the bottom surface 105S of the insulating film 104 (or an interface between the insulating film 104 and the dielectric layer DI) has a roughness smaller than that of the interface IF. In certain embodiments, the bottom surface 105S of the insulating film 104 has a surface roughness of around 0.1 μm to 1 μm. Furthermore, in some embodiments, the bottom surface 105S of the insulating film 104 (or an interface between the insulating film 104 and the dielectric layer DI) has a substantially linear profile.

Figure 2A:
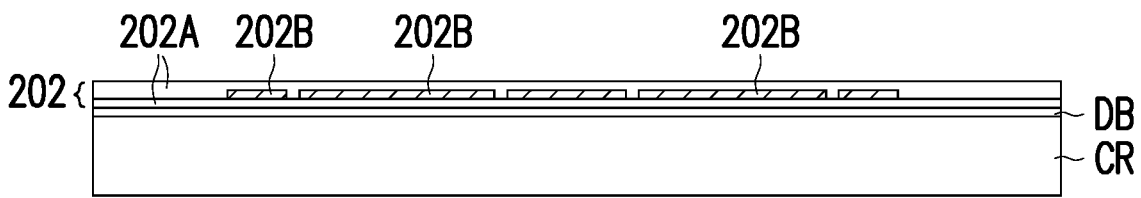
FIG. 2A to FIG. 2H are schematic sectional views of various stages in a method of fabricating a package structure according to some exemplary embodiments of the present disclosure.

FIG. 2A to FIG. 2H are schematic sectional views of various stages in a method of fabricating a package structure according to some exemplary embodiments of the present disclosure. Referring to FIG. 2A, in some embodiments, a carrier CR is provided. In some embodiments, the carrier CR may be a glass carrier or any suitable carrier for carrying a semiconductor wafer or a reconstituted wafer for the manufacturing method of the package structure. In some embodiments, the carrier CR is coated with a debond layer DB. The material of the debond layer DB may be any material suitable for bonding and de-bonding the carrier CR from the above layer(s) or any wafer(s) disposed thereon.

In some embodiments, the debond layer DB may include a dielectric material layer made of a dielectric material including any suitable polymer-based dielectric material (such as benzocyclobutene ("BCB"), polybenzoxazole ("PBO")). In an alternative embodiment, the debond layer DB may include a dielectric material layer made of an epoxy-based thermal-release material, which loses its adhesive property when heated, such as a light-to-heat-conversion (LTHC) release coating film. In a further alternative embodiment, the debond layer DB may include a dielectric material layer made of an ultra-violet (UV) glue, which loses its adhesive property when exposed to UV lights. In certain embodiments, the debond layer DB may be dispensed as a liquid and cured, or may be a laminate film laminated onto the carrier CR, or may be the like. The top surface of the debond layer DB, which is opposite to a bottom surface contacting the carrier CR, may be levelled and may have a high degree of coplanarity. In certain embodiments, the debond layer DB is, for example, a LTHC layer with good chemical resistance, and such layer enables room temperature de-bonding from the carrier CR by applying laser irradiation, however the disclosure is not limited thereto.

In an alternative embodiment, a buffer layer (not shown) may be coated on the debond layer DB, where the debond layer DB is sandwiched between the buffer layer and the carrier CR, and the top surface of the buffer layer may further provide a high degree of coplanarity. In some embodiments, the buffer layer may be a dielectric material layer. In some embodiments, the buffer layer may be a polymer layer which made of polyimide, PBO, BCB, or any other suitable polymer-based dielectric material. In some embodiments, the buffer layer may be Ajinomoto Buildup Film (ABF), Solder Resist film (SR), or the like. In other words, the buffer layer is optional and may be omitted based on the demand, so that the disclosure is not limited thereto.

Furthermore, as illustrated in FIG. 2A, a redistribution layer 202 is formed over the carrier CR. For example, in FIG. 2A, the redistribution layer 202 is formed on the debond layer DB, and the formation of the redistribution layer 202 includes sequentially forming one or more dielectric layers 202A and one or more conductive layers 202B in alternation. In some embodiments, the redistribution layer 202 includes two dielectric layers 202A and one conductive layer 202B as shown in FIG. 2A, where the conductive layer 202B is sandwiched between the dielectric layers 202A. However, the disclosure is not limited thereto. The numbers of the dielectric layers 202A and the conductive layer 202B included in the redistribution layer 202 is not limited thereto, and may be designated and selected based on the demand. For example, the numbers of the dielectric layers 202A and the conductive layers 202B may be one or more than one.

In certain embodiments, the material of the dielectric layers 202A may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the material of the dielectric layers 202A may be formed by suitable fabrication techniques such as spin-on coating, chemical vapor deposition (CVD), plasma-enhanced chemical vapor deposition (PECVD) or the like. The disclosure is not limited thereto.

In some embodiments, the material of the conductive layer 202B may be made of conductive materials formed by electroplating or deposition, such as aluminum, titanium, copper, nickel, tungsten, and/or alloys thereof, which may be patterned using a photolithography and etching process. In some embodiments, the conductive layer 202B may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

Figure 2B:
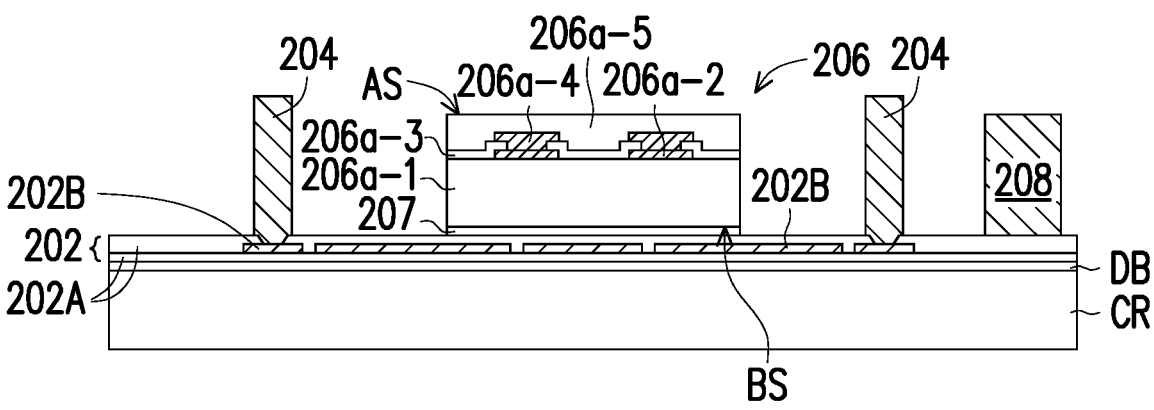

Referring to FIG. 2B, after forming the redistribution layer 202, at least one semiconductor die 206 and a plurality of through insulator vias 204 are provided on the redistribution layer 202 over the carrier CR. In some embodiments, the through insulator vias 204 are through integrated fan-out ("InFO") vias. In one embodiment, the formation of the through insulator vias 204 includes forming a mask pattern (not shown) with openings, then forming a metallic material (not shown) filling up the openings by electroplating or deposition, and removing the mask pattern to form the through insulator vias 204 on the redistribution layer 202. In certain embodiments, the through insulator vias 204 fills into a via opening that reveals the conductive layer 202B of the redistribution layer 202, so that the through insulator vias 204 may be electrically connected to the redistribution layer 202. In some embodiments, the material of the mask pattern may include a positive photo-resist or a negative photo-resist. In one embodiment, the material of the through insulator vias 204 may include a metal material such as copper or copper alloys, or the like. However, the disclosure is not limited thereto.

In an alternative embodiment, the through insulator vias 204 may be formed by forming a seed layer (not shown) on the redistribution layer 202; forming the mask pattern with openings exposing portions of the seed layer; forming the metallic material on the exposed portions of the seed layer to form the through insulator vias 204 by plating; removing the mask pattern; and then removing portions of the seed layer exposed by the through insulator vias 204. For example, the seed layer may be a titanium/copper composited layer. For simplification, only two through insulator vias 204 are illustrated in FIG. 2B. However, it should be noted that the number of through insulator vias 204 is not limited thereto, and can be selected based on requirement.

Furthermore, in some embodiments, at least one dipole antenna 208 may be formed during the formation of the through insulator vias 204. In some embodiments, the dipole antenna 208 has a dimension (e.g., width) greater than that of the through insulator vias 204. However, the present disclosure is not limited thereto. In alternative embodiments, the dipole antenna 208 has a dimension (e.g., width) substantially equal to or less than that of the through insulator vias 204. For example, the dipole antenna 208 may be disposed on the redistribution layer 202 and be adjacent to the through insulator vias 204.

As illustrated in FIG. 2B, at least one semiconductor die 206 is picked and placed on the redistribution layer 202. In certain embodiments, the semiconductor die 206 has an active surface AS, and a backside surface BS opposite to the active surface AS. For example, the backside surface BS of the semiconductor die 206 may be attached to the redistribution layer 202 through a die attach film 207. By using the die attach film 207, a better adhesion between the semiconductor die 206 and the redistribution layer 202 is ensured. In the exemplary embodiment, only one semiconductor die 206 is illustrated. However, it should be noted that the number of semiconductor dies placed on the redistribution layer 202 is not limited thereto, and this can be adjusted based on design requirement.

In the exemplary embodiment, the semiconductor die 206 includes a semiconductor substrate 206a-1, a plurality of conductive pads 206a-2, a passivation layer 206a-3, a plurality of conductive posts 206a-4, and a protection layer 206a-5. As illustrated in FIG. 2B, the plurality of conductive pads 206a-2 is disposed on the semiconductor substrate 206a-1. The passivation layer 206a-3 is formed over the semiconductor substrate 206a-1 and has openings that partially expose the conductive pads 206a-2 on the semiconductor substrate 206a-1. The semiconductor substrate 206a-1 may be a bulk silicon substrate or a silicon-on-insulator (SOI) substrate, and further includes active components (e.g., transistors or the like) and optionally passive components (e.g., resistors, capacitors, inductors or the like) formed therein. The conductive pads 206a-2 may be aluminum pads, copper pads or other suitable metal pads. The passivation layer 206a-3 may be a silicon oxide layer, a silicon nitride layer, a silicon oxy-nitride layer or a dielectric layer formed of any suitable dielectric materials. Furthermore, in some embodiments, a post-passivation layer (not shown) is optionally formed over the passivation layer 206a-3. The post-passivation layer covers the passivation layer 206a-3 and has a plurality of contact openings. The conductive pads 206a-2 are partially exposed by the contact openings of the post passivation layer. The post-passivation layer may be a benzocyclobutene (BCB) layer, a polyimide layer, a polybenzoxazole (PBO) layer, or a dielectric layer formed by other suitable polymers. In some embodiments, the conductive posts 206a-4 are formed on the conductive pads 206a-2 by plating. In some embodiments, the protection layer 206a-5 is formed on the passivation layer 206a-3 or on the post passivation layer, and covering the conductive posts 206a-4 so as to protect the conductive posts 206a-4.

In some embodiments, when more than one semiconductor die 206 are placed on the redistribution layer 202, the semiconductor dies 206 may be arranged in an array, and when the semiconductor dies 206 are arranged in an array, the through insulator vias 204 may be classified into groups. The number of the semiconductor dies 206 may correspond to the number of groups of the through insulator vias 204. In the exemplary embodiment, the semiconductor die 206 may be picked and placed on the redistribution layer 202 after the formation of the through insulator vias 204. However, the disclosure is not limited thereto. In some alternative embodiments, the semiconductor die 206 may be picked and placed on the redistribution layer 202 before the formation of the through insulator vias 204.

In some embodiments, the semiconductor die 206 may be selected from application-specific integrated circuit (ASIC) chips, analog chips (for example, wireless and radio frequency chips), digital chips (for example, a baseband chip), integrated passive devices (IPDs), voltage regulator chips, sensor chips, memory chips, or the like. The disclosure is not limited thereto.

Figure 2C:
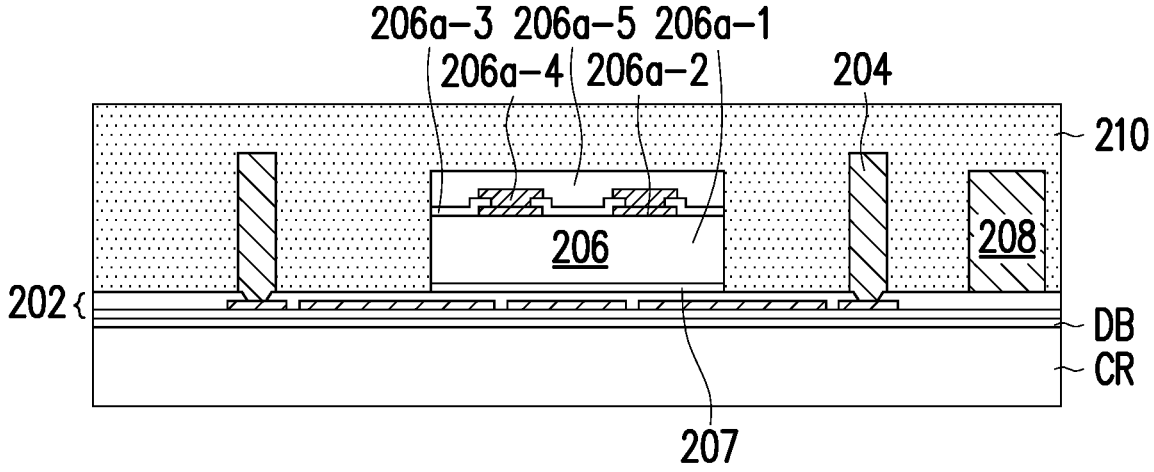

Referring to FIG. 2C, an insulating material 210 is formed on the redistribution layer 202 and over the semiconductor die 206. In some embodiments, the insulating material 210 is formed through, for example, a compression molding process, filling up the gaps between the semiconductor die 206 and the through insulating vias 204 to encapsulate the semiconductor die 206. The insulating material 208 also fills up the gaps between adjacent through insulator vias 204 and dipole antenna 208 to encapsulate the through insulator vias 204 and the dipole antenna 208. The conductive posts 206a-4 and the protection layer 206a-5 of the semiconductor die 206 are encapsulated by and well protected by the insulating material 210. In other words, the conductive posts 206a-4 and the protection layer 206a-5 of the semiconductor die 206 are not revealed and are well protected by the insulating material 210.

In some embodiments, the insulating material 210 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating material 210 may include an acceptable insulating encapsulation material. In some embodiments, the insulating material 210 may further include inorganic filler or inorganic compound (e.g. silica, clay, and so on) which can be added therein to optimize coefficient of thermal expansion (CTE) of the insulating material 210. The disclosure is not limited thereto.

Figure 2D:
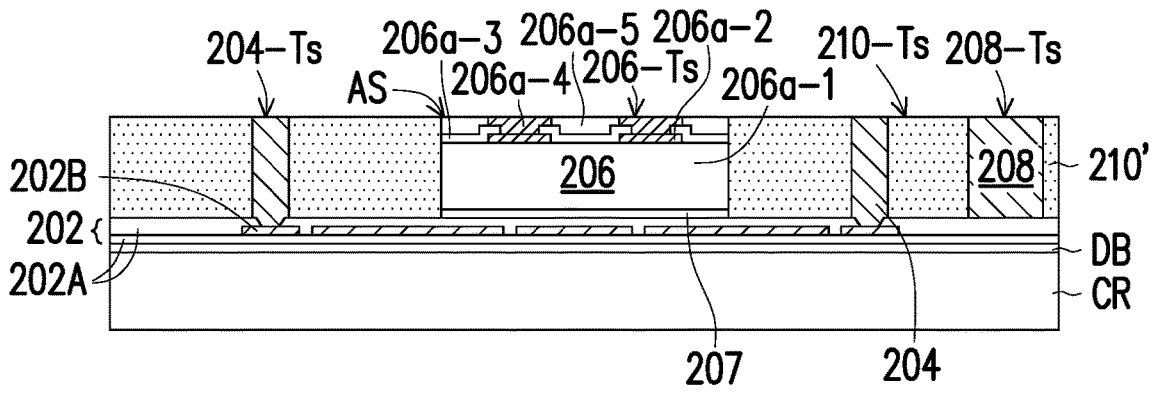

Referring to FIG. 2D, in some embodiments, the insulating material 210 is partially removed to expose the conductive posts 206a-5, the through insulator vias 204 and the dipole antenna 208. In some embodiments, the insulating material 210 and the protection layer 206a-5 are ground or polished by a planarization step. For example, the planarization step is performed through a mechanical grinding process and/or a chemical mechanical polishing (CMP) process until the top surfaces 206-Ts of the conductive posts 206a-4 are revealed. In some embodiments, the through insulator vias 204 may be partially polished so that the top surfaces 204-Ts of the through insulator vias 204 are levelled with the top surfaces 206-Ts of the conductive posts 206a-4, or levelled with the active surface AS of the semiconductor die 206. Similarly, the dipole antenna 208 may be partially polished so that the top surfaces 208-Ts of the dipole antenna 208 are levelled with the top surfaces 206-Ts of the conductive posts 206a-4, or levelled with the active surface AS of the semiconductor die 206. In other words, the conductive posts 206a-4, the through insulator vias 204 and the dipole antenna 208 may also be slightly grinded/polished.

In the illustrated embodiment, the insulating material 210 is polished to form an insulating encapsulant 210'. In some embodiments, the top surface 210-Ts of the insulating encapsulant 210', the top surface 204-Ts of the through insulator vias 204, the top surface 206-Ts of the conductive posts 206a-4, the top surface of the polished protection layer 206a-5, and the top surface 208-Ts of the dipole antenna 208 are coplanar and levelled with one another. In some embodiments, after the mechanical grinding or chemical mechanical polishing (CMP) steps, a cleaning step may be optionally performed. For example, the cleaning step is preformed to clean and remove the residue generated from the planarization step. However, the disclosure is not limited thereto, and the planarization step may be performed through any other suitable methods.

Figure 2E:
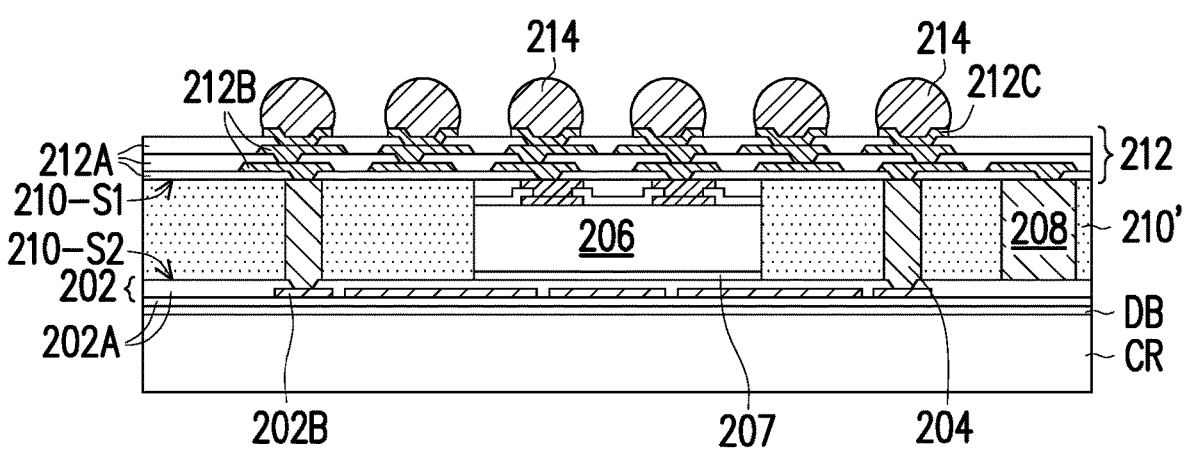

Referring to FIG. 2E, after the planarization step, a redistribution layer 212 is formed on the insulating encapsulant 210', the through insulator vias 204, the dipole antenna 208, and on the semiconductor die 206. For example, the redistribution layer 212 is formed on the top surface 204-Ts of the through insulator vias 204, on the top surface 206-Ts of the conductive posts 206a-4, and on the top surface 210-Ts of the insulating encapsulant 210'. In some embodiments, the redistribution layer 212 is electrically connected to the through insulator vias 204, and is electrically connected to the semiconductor die 206 through the conductive posts 206a-4. In some embodiments, the semiconductor die 206 is electrically connected to the through insulator vias 204 through the redistribution layer 212. In certain embodiments, the redistribution layer 212 is electrically connected to the dipole antenna 208. In the illustrated embodiment, the insulating encapsulant 210' has a first surface 210-S1 and a second surface 210-S2, wherein the second surface S10-S2 is opposite to the first surface 210-S1. The redistribution layer 202 is located on the second surface 210-S2 of the insulating encapsulant 210', whereas the redistribution layer 212 is located on the first surface 210-S1 of the insulating encapsulant 210'.

In some embodiments, the formation of the redistribution layer 212 includes sequentially forming one or more dielectric layers 212A, and one or more conductive layers 212B in alternation. In certain embodiments, the conductive layers 212B are sandwiched between the dielectric layers 212A. Although only two layers of the conductive layers 212B and three layers of dielectric layers 212A are illustrated herein, however, the scope of the disclose is not limited by the embodiments of the disclosure. In other embodiments, the number of conductive layers 212B and the dielectric layers 212A may be adjusted based on product requirement. In some embodiments, the conductive layers 212B are electrically connected to the conductive posts 206a-4 of the semiconductor die 206. Furthermore, the conductive layers 212B are electrically connected to the through insulator vias 204 and the dipole antenna 208. In some embodiments, the materials of the dielectric layer 212A and the conductive layer 212B of the redistribution layer 212 is similar to a material of the dielectric layer 202A and the conductive layer 202B mentioned for the redistribution layer 202. Therefore, the detailed description of the dielectric layer 212A and the conductive layer 212B will be omitted herein.

After forming the redistribution layer 212, a plurality of conductive pads 212C may be disposed on an exposed top surface of the topmost layer of the conductive layers 212B for electrically connecting with conductive balls. In certain embodiments, the conductive pads 212C are for example, under-ball metallurgy (UBM) patterns used for ball mount. As shown in FIG. 2E, the conductive pads 212C are formed on and electrically connected to the redistribution layer 212. In some embodiments, the materials of the conductive pads 212C may include copper, nickel, titanium, tungsten, or alloys thereof or the like, and may be formed by an elec-troplating process, for example. The number of conductive pads 212C is not limited in this disclosure, and may be selected based on the design layout. In some alternative embodiments, the conductive pads 212C may be omitted. In other words, conductive balls 214 formed in subsequent steps may be directly disposed on the redistribution layer 212.

After forming the conductive pads 212C, a plurality of conductive balls 214 is disposed on the conductive pads 212C and over the redistribution layer 212. In some embodi-ments, the conductive balls 214 may be disposed on the conductive pads 212C by a ball placement process or reflow process. In some embodiments, the conductive balls 214 are, for example, solder balls or ball grid array (BGA) balls. In some embodiments, the conductive balls 214 are connected to the redistribution layer 212 through the conductive pads 212C. In certain embodiments, some of the conductive balls 214 may be electrically connected to the semiconductor die 206 through the redistribution layer 212. Furthermore, some of the conductive balls 214 may be electrically connected to the through insulator vias 204 through the redistribution layer 212. The number of the conductive balls 214 is not limited to the disclosure, and may be designated and selected based on the number of the conductive pads 212C. In some alternative embodiments, an integrated passive device (IPD) (not shown) may optionally be disposed on the redistribution layer 212 and electrically connected to the redistribution layer 212.

Figure 2F:
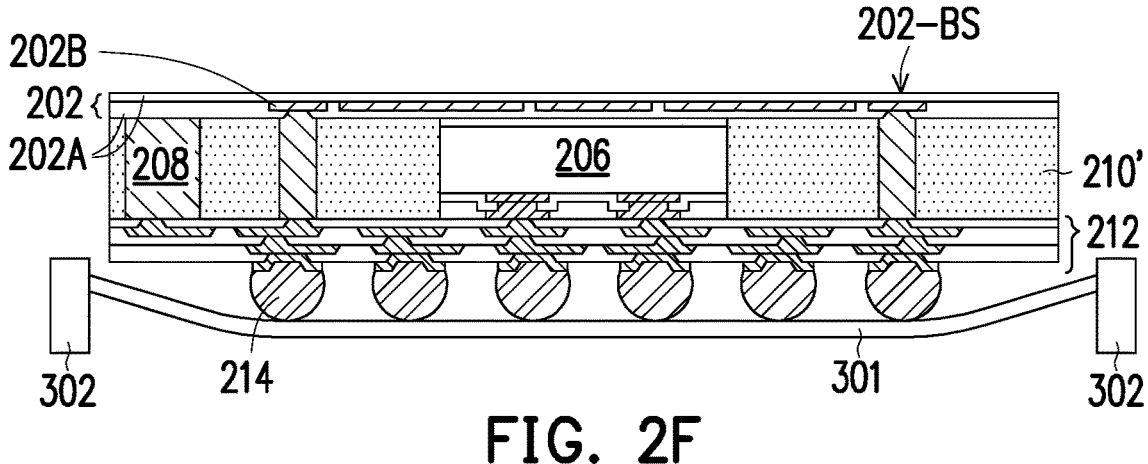

Referring to FIG. 2F, in some embodiments, after forming the redistribution layer 212 and the conductive balls 214, the structure shown in FIG. 2E may be turned upside down and attached to a tape 301 (e.g., a dicing tape) supported by a frame 302. As illustrated in FIG. 2F, the carrier CR is debonded and is separated from the redistribution layer 202. In some embodiments, the de-bonding process includes projecting a light such as a laser light or an UV light on the debond layer DB (e.g., the LTHC release layer) so that the carrier CR can be easily removed along with the debond layer DB. During the de-bonding step, the tape 301 is used to secure the package structure before de-bonding the carrier CR and the debond layer DB. After the de-bonding process, a backside surface 202-BS of the redistribution layer 202 is revealed or exposed. In certain embodiments, a dielectric layer 202A of the redistribution layer 202 is revealed or exposed.

Figure 2G:
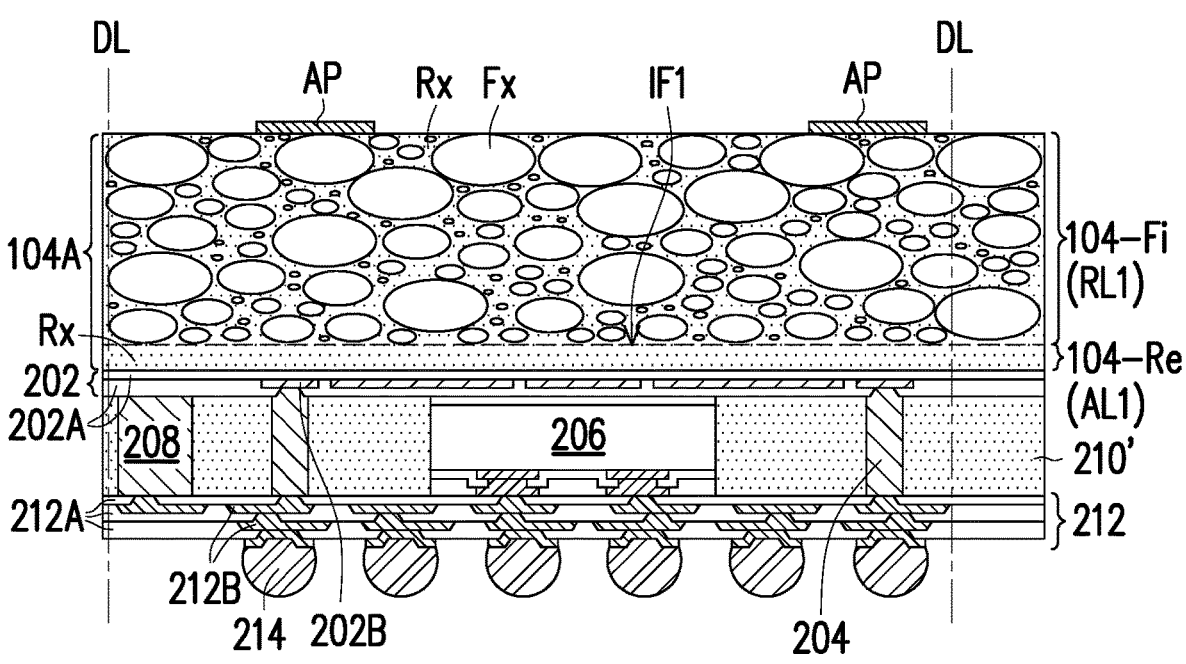

Referring to FIG. 2G, in a next step, a first insulating film 104A is laminated on the redistribution layer 202 to cover the exposed backside surface 202-BS of the redistribution layer 202. In some embodiments, the first insulating film 104A is laminated on the redistribution layer 202 through a vacuum laminator. Furthermore, in certain embodiments, the first insulating film 104A is cured at a temperature range of 150° C. to 180° C. after lamination so that the first insulating film 104A can be properly adhered onto the redistribution layer 202. In the exemplary embodiment, the first insulating film 104A is prepared using the same method described for the insulating film 104 in FIG. 1A, FIG. 1B, and has an arrangement similar to FIG. 1C. In other words, the first insulating film 104A contains a resin rich region 104-Re and a filler rich region 104-Fi. In some embodiments, the filler rich region 104-Fi may constitute a first resin layer RL1, wherein the first resin layer RL1 includes a plurality of fillers Fx. In certain embodiments, the resin rich region 104-Re may constitute a first adhesive layer AL1, wherein the first adhesive layer AL1 is substantially filler free. Furthermore, an interface IF1 is located in between the resin rich region 104-Re and the filler rich region 104-Fi. The thickness ratio of the first adhesive layer AL1 to the first resin layer RL1 is the same as that described for the adhesive layer AL and resin layer RL. Furthermore, the details of the resin material Rx and the fillers Fx used in the first insulating film 104A is the same as those used for the insulating film 104, and its description will be omitted herein.

As illustrated in FIG. 2G, the resin rich region 104-Re (first adhesive layer AL1) is sandwiched in between the filler rich region 104-Fi (first resin layer RL1) and the redistri-bution layer 202. In some embodiments, the resin rich region 104-Re (first adhesive layer AL1) is separating the filler rich region 104-Fi (first resin layer RL1) from the redistribution layer 202. Furthermore, the resin rich region 104-Re (first adhesive layer AL1) is in physical contact with a dielectric layer 202A of the redistribution layer 202. In certain embodiments, contacting surfaces between the resin rich region 104-Re (first adhesive layer AL1) and the dielectric layer 202A is free of fillers Fx. In other words, the contacting surfaces between the resin rich region 104-Re (first adhesive layer AL1) and the dielectric layer 202A is substantially planar.

After laminating the first insulating film 104A on the redistribution layer 202, a plurality of antenna patterns AP is formed on the first insulating film 104A. The first insulating film 104A is, for example, located in between the antenna patterns AP and the redistribution layer 202. As illustrated in FIG. 2G the antenna patterns AP are formed on the surface of the first insulating film 104A opposite to a side where the redistribution layer 202 is located. In some embodiments, the antenna patterns AP are electrically coupled with some of the conductive layers 202B of the redistribution layer 202, wherein the conductive layers 202B may serve as ground plates. In certain embodiments, the antenna patterns AP may be electrically connected to some of the conductive layers 202B of redistribution layer 202 through a feed line (not shown), the disclosure is not limited thereto. In some embodiments, the antenna patterns AP are formed by form-ing a metallization layer (not shown) by electroplating or deposition over the first insulating film 104A and then patterning the metallization layer by photolithographic and etching processes. In an alternative embodiment, the antenna patterns AP are formed by forming a metallization layer (not shown) by a plating process. In some embodiments, the antenna patterns AP may include patch antennas.

Figure 2H:
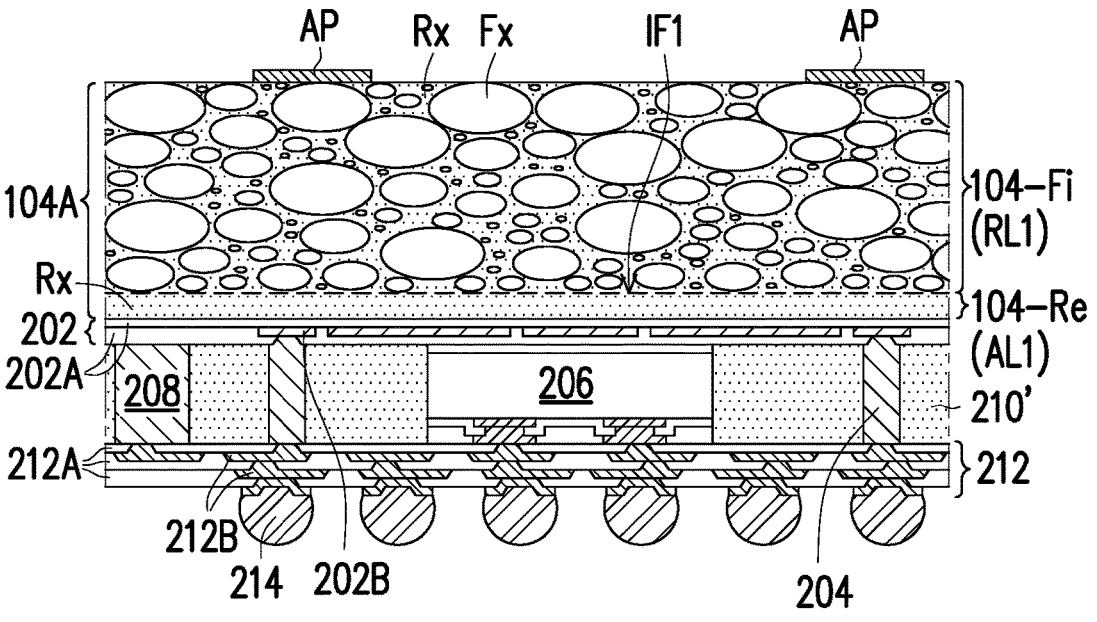

Referring to FIG. 2H, after forming the antenna patterns AP, a dicing process is performed along the dicing lines DL (shown in FIG. 2G) to cut the whole wafer structure (cutting through the first insulating film 104A, the insulating encapsulant 210', and the redistribution layers 202 and 212) into a plurality of package structures PK1. In the exemplary embodiment, the dicing process is a wafer dicing process including mechanical blade sawing or laser cutting. In a subsequent process, the separated package structures PK1 may for example, be disposed onto a circuit substrate or onto other components based on requirements.

FIG. 3A to FIG. 3G are schematic sectional views of various stages in a method of fabricating a package structure according to some exemplary embodiments of the present disclosure. The method of fabricating the package structure shown in FIG. 3A to FIG. 3G is similar to the method of fabricating the package structure shown in FIG. 2A to FIG. 2H. Hence, the same reference numerals will be used to refer to the same or liked parts, and its detailed description will be omitted herein. The difference between the embodiments is in the sequence of the fabrication process.

Figure 3A:
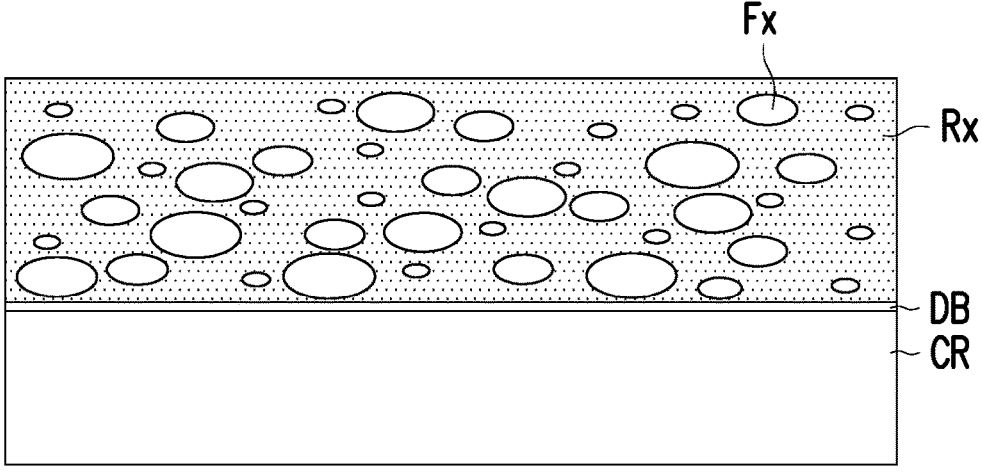
FIG. 3A to FIG. 3G are schematic sectional views of various stages in a method of fabricating a package structure according to some exemplary embodiments of the present disclosure.
Figure 3B:
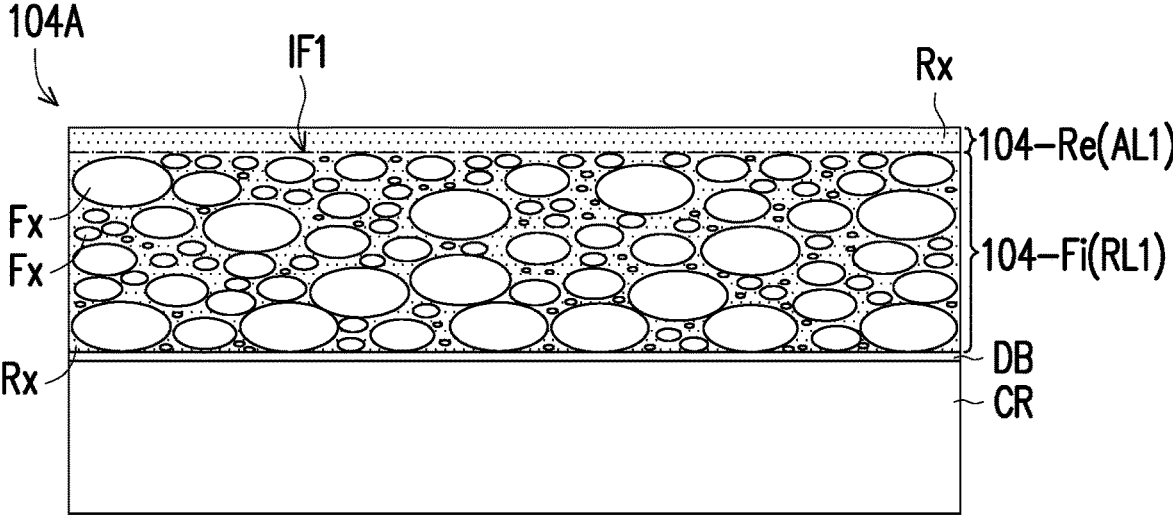

Referring to FIG. 3A, a resin material Rx is provided on the debond layer DB over the carrier CR, and a plurality of fillers Fx is dispersed in the resin material Rx. Referring to FIG. 3B, a viscosity of the resin material Rx is adjusted or lowered so as to form a first insulating film 104A. For example, the viscosity of the resin material Rx is adjusted or lowered so that the dispersed fillers Fx can be clustered on one side of the resin material Rx to define a filler rich region 104-Fi (first resin layer RL1) and a resin rich region 104-Re (first adhesive layer AL1). The filler rich region 104-Fi (first resin layer RL1) is, for example, located in between the resin rich region 104-Re (first adhesive layer AL1) and the debond layer DB, and an interface IF1 exist between the filler rich region 104-Fi (first resin layer RL1) and the resin rich region 104-Re (first adhesive layer AL1).

Figure 3C:
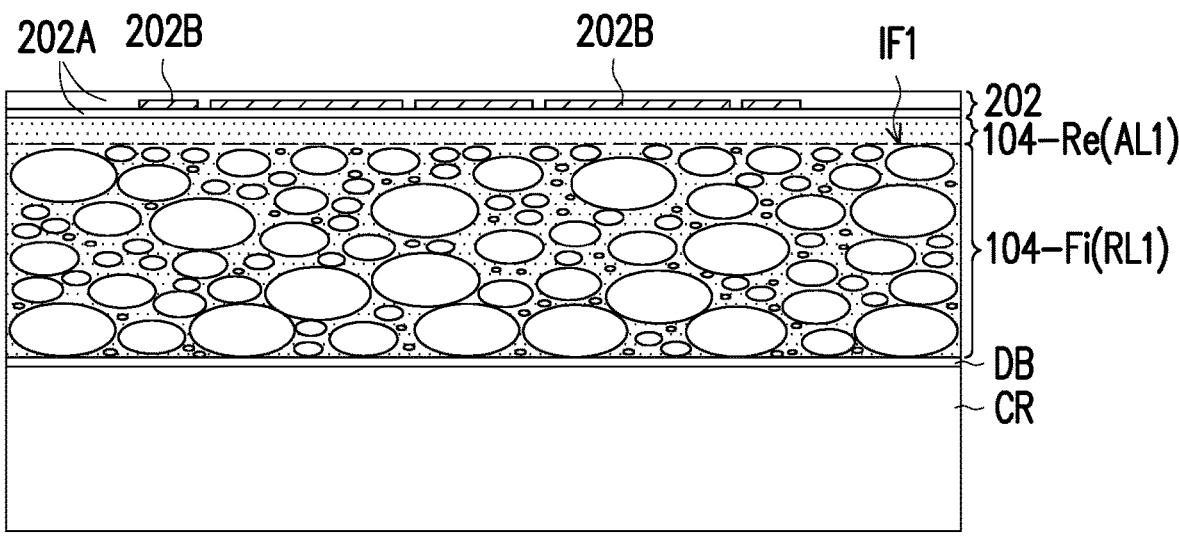
Figure 3D:
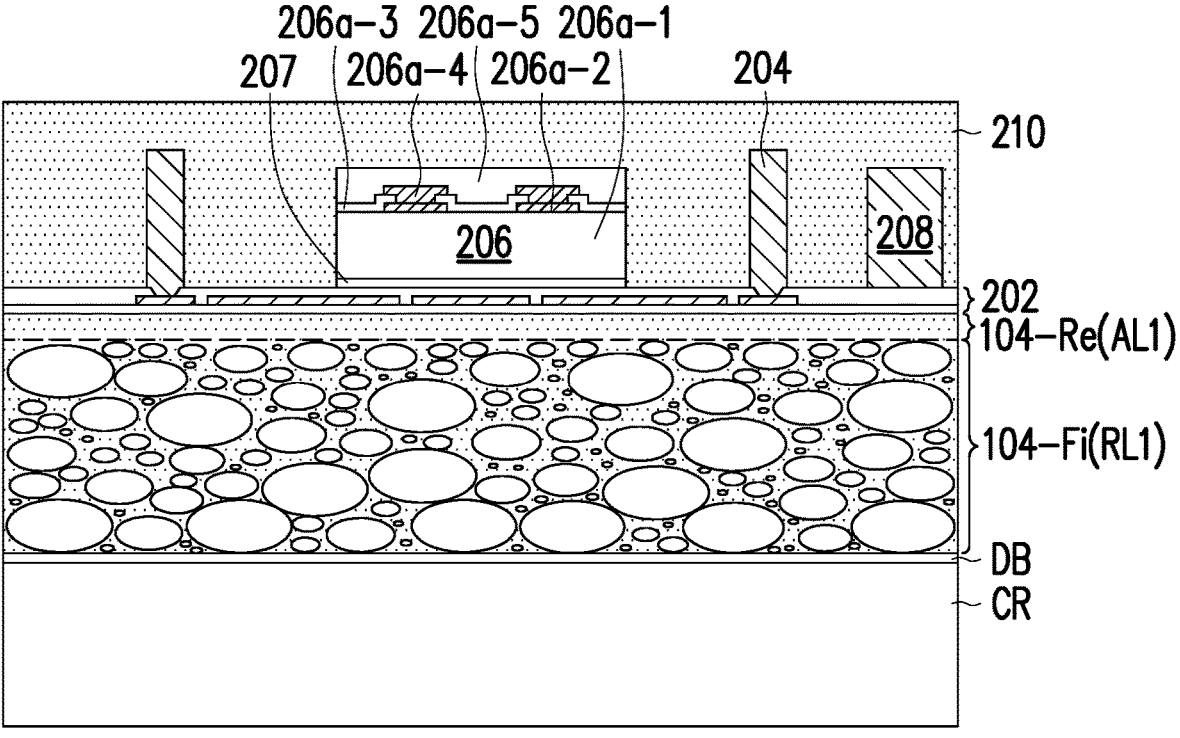

Referring to FIG. 3C, a redistribution layer 202 is formed on the first insulating film 104A. For example, the dielectric layer 202A of the redistribution layer 202 is adhered to the resin rich region 104-Re (first adhesive layer AL1) of the first insulating film 104. Referring to FIG. 3D, after forming the redistribution layer 202, the same processing steps may be performed to dispose semiconductor dies 206 on the redistribution layer 202, and to form through insulator vias 204 and dipole antenna 208 on the redistribution layer 202. Thereafter, an insulating material 210 is formed on the redistribution layer 202 to cover the semiconductor dies 206, the through insulator vias 204 and dipole antenna 208.

Figures 3E, 3F:
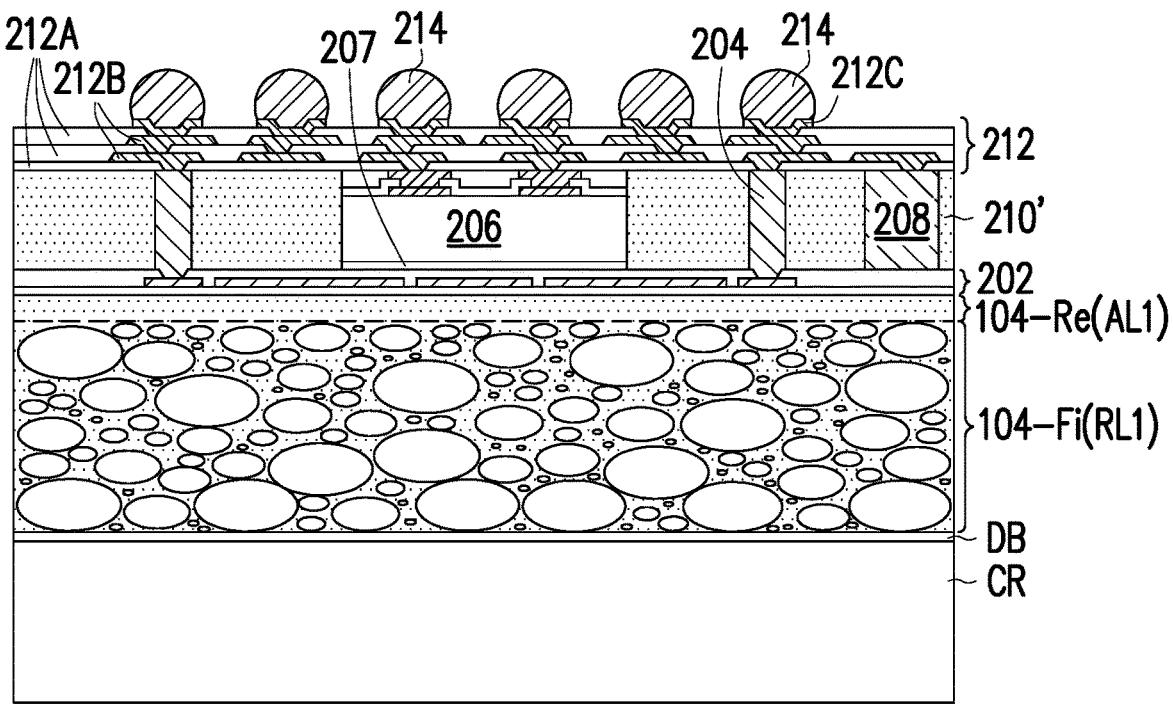

Referring to FIG. 3E, in a subsequent step, the insulating material 210 is planarized to form an insulating encapsulant 210'. Thereafter, a redistribution layer 212 is formed on the insulating encapsulant 210', the through insulator vias 204, the dipole antenna 208, and on the semiconductor die 206. For example, the redistribution layer 212 is electrically connected to the through insulator vias 204, the semiconductor die 206 and the dipole antenna 208. Subsequently, a plurality of conductive pads 212C may be disposed on the redistribution layer 212 and be electrically connected to the conductive layers 212B. Conductive balls 214 may then be disposed on the conductive pads 212C by a ball placement process or reflow process.

Referring to FIG. 3F, after forming the redistribution layer 212 and the conductive balls 214, the structure shown in FIG. 3E may be turned upside down and attached to a tape supported by a frame (not shown). Subsequently, the carrier CR is debonded and is separated from the first insulating film 104A to reveal a backside of the first insulating film 104A. For example, the de-bonding process includes projecting a light such as a laser light or an UV light on the debond layer DB (e.g., the LTHC release layer) so that the carrier CR can be easily removed along with the debond layer DB. After the de-bonding process, a plurality of antenna patterns AP is then formed on the first insulating film 104A.

Figure 3G:
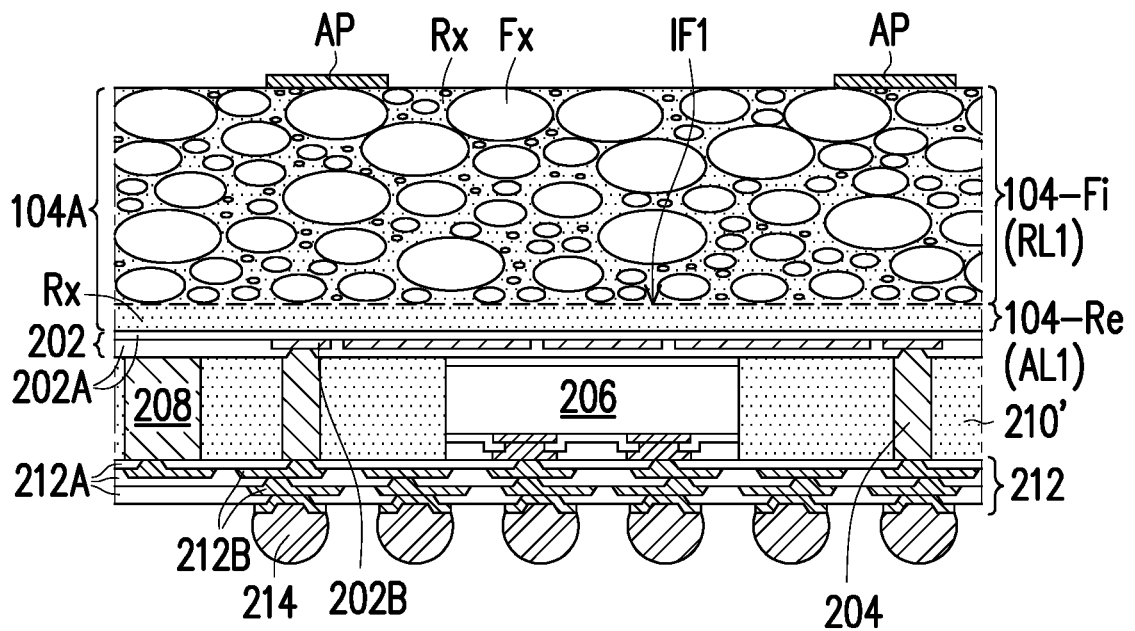

Referring to FIG. 3G, after forming the antenna patterns AP, a dicing process is performed along the dicing lines DL (shown in FIG. 3F) to cut the whole wafer structure (cutting through the first insulating film 104A, the insulating encapsulant 210', and the redistribution layers 202 and 212) into a plurality of package structures PK1. In the exemplary embodiment, the dicing process is a wafer dicing process including mechanical blade sawing or laser cutting. In a subsequent process, the separated package structures PK1 may for example, be disposed onto a circuit substrate or onto other components based on requirements.

Figure 4:
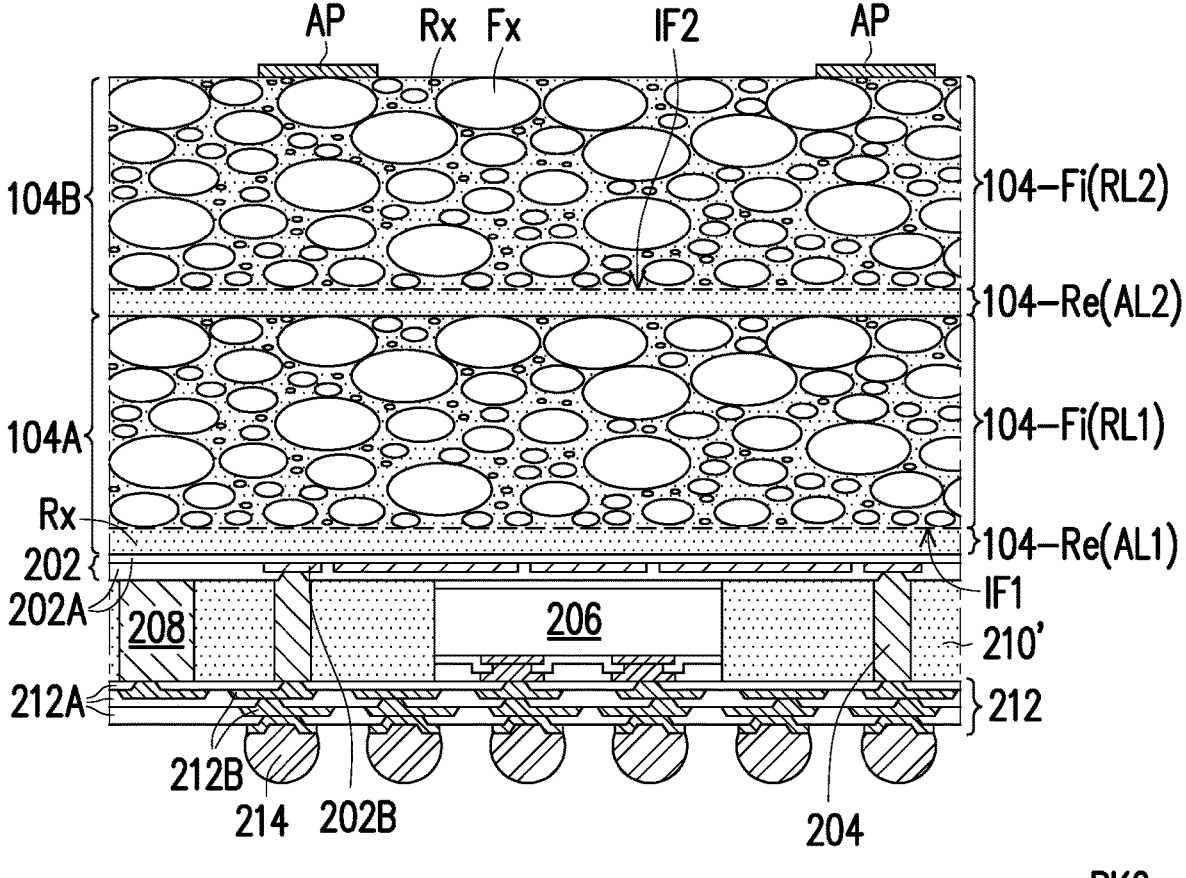
FIG. 4 is a package structure according to some embodiments of the present disclosure.

FIG. 4 is a package structure according to some embodiments of the present disclosure. The package structure PK2 illustrated in FIG. 4 is similar to the package structure PK1 illustrated in FIG. 2H and FIG. 3G. Hence, the same reference numerals will be used to refer to the same or liked parts, and its detailed description will be omitted herein. The difference between the embodiments is that a second insulating film 104B is further provided.

As illustrated in FIG. 4, after laminating the first insulating film 104A on the redistribution layer 202, a second insulating film 104B is laminated on the first insulating film 104A. In some embodiments, the second insulating film 104B is laminated on the first insulating film 104A through a vacuum laminator. Furthermore, in certain embodiments, the second insulating film 104B is cured at a temperature range of 150° C. to 180° C. after lamination so that the second insulating film 104B can be properly adhered onto the first insulating film 104A. In the exemplary embodiment, the second insulating film 104B is prepared using the same method described for the insulating film 104 in FIG. 1A, FIG. 1B, and has an arrangement similar to FIG. 1C. In other words, the second insulating film 104B contains a resin rich region 104-Re and a filler rich region 104-Fi. In some embodiments, the filler rich region 104-Fi may constitute a second resin layer RL2, wherein the second resin layer RL2 includes a plurality of fillers Fx. In certain embodiments, the resin rich region 104-Re may constitute a second adhesive layer AL2, wherein the second adhesive layer AL2 is substantially filler free. Furthermore, an interface IF2 is located in between the resin rich region 104-Re (second adhesive layer AL2) and the filler rich region 104-Fi (second resin layer RL2). The thickness ratio of the second adhesive layer AL2 to the second resin layer RL2 is the same as that described for the adhesive layer AL and resin layer RL. Furthermore, the details of the resin material Rx and the fillers Fx used in the second insulating film 104B is the same as those used for the insulating film 104, and its description will be omitted herein.

Furthermore, as illustrated in FIG. 4, the resin rich region 104-Re (second adhesive layer AL2) is sandwiched in between the filler rich region 104-Fi (second resin layer RL2) of the second insulating film 104B and the filler rich region 104-Fi (first resin layer RL1) of the first insulating film 104A. Furthermore, the resin rich region 104-Re (second adhesive layer AL2) of the second insulating film 104B is in physical contact with the filler rich region 104-Fi (first resin layer RL1) of the first insulating film 104A. Although only two insulating films (104A/104B) are illustrated herein, the disclosure is not limited thereto. In some other embodiments, more than two insulating films may be disposed on the redistribution layer 202, wherein the insulating films are adhered to one another through the resin rich region (adhesive layer). In certain embodiments, the plurality of antenna patterns AP is disposed on the second insulating film 104B. In some embodiments, the second insulating film 104B is sandwiched between the antenna patterns AP and the first insulating film 104A.

Figure 5:
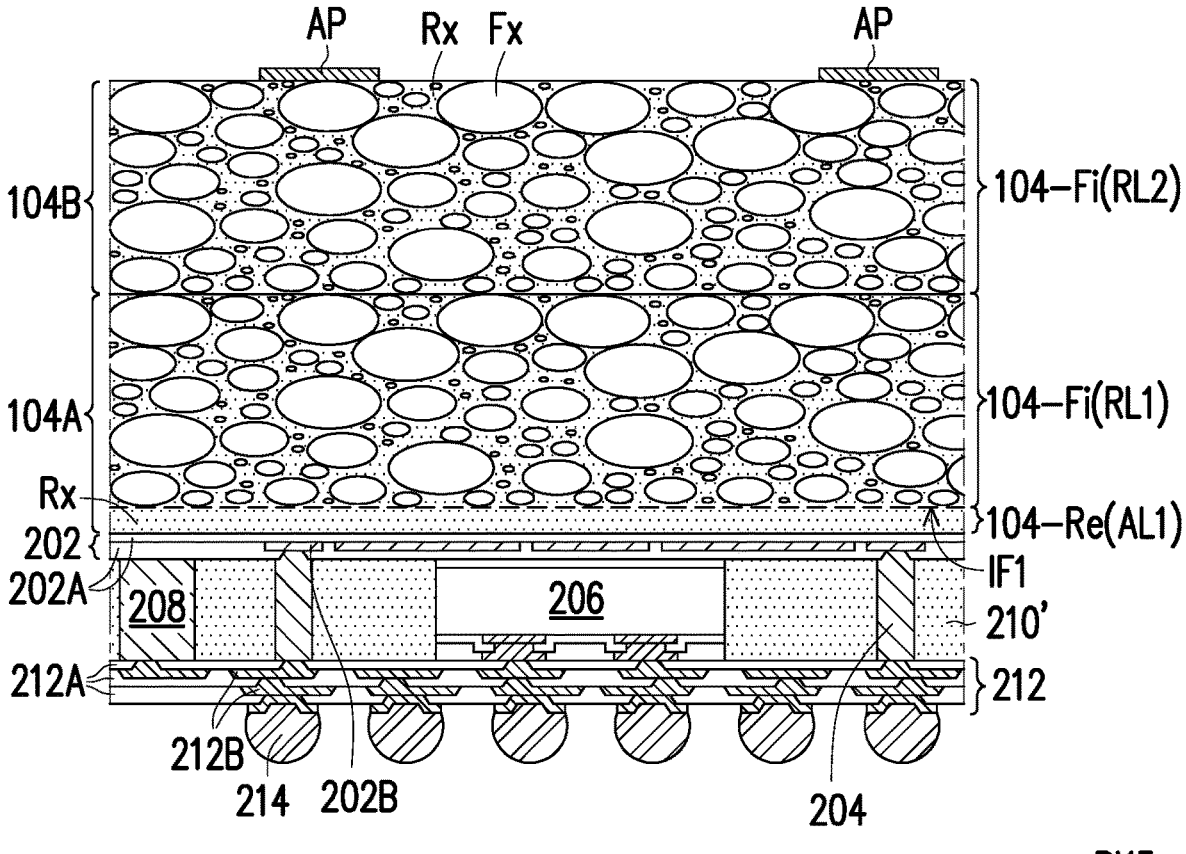
FIG. 5 is a package structure according to some other embodiments of the present disclosure.

FIG. 5 is a package structure according to some other embodiments of the present disclosure. The package structure PK3 illustrated in FIG. 5 is similar to the package structure PK2 illustrated in FIG. 4. Hence, the same reference numerals will be used to refer to the same or liked parts, and its detailed description will be omitted herein. The difference between the embodiments is that the resin rich region 104-Re (second adhesive layer AL2) of the second insulating film 104B is omitted in FIG. 5.

As illustrated in FIG. 5, after laminating a first insulating film 104A on the redistribution layer 202, a second insulating film 104B is laminated on the first insulating film 104A. In the exemplary embodiment, the second insulating film 104B contains a filler rich region 104-Fi (second resin layer RL2), whereas the resin rich region is omitted. For example, the filler rich region 104-Fi (second resin layer RL2) of the second insulating film 104B is in physical contact with the filler rich region 104-Fi (first resin layer RL1) of the first insulating film 104A. Since both of the filler rich region 104-Fi of the first insulating film 104A and the second insulating film 104B includes adhesive resin materials Rx, the first insulating film 104A and second insulating film 104B may still be sufficiently adhered to one another. However, a resin rich region 104-Re (first adhesive layer AL1) is present in the first insulating film 104A so as to prevent the delamination between the redistribution layer 202 and the first insulating film 104A.

According to the above embodiments, since the package structure includes an insulating film having a filler rich region (resin layer with fillers) and a resin rich region (adhesive layer), the insulating film can have a higher adhesion strength to the redistribution layer. In addition, no further modification of material or surface treatment on the redistribution layer is required to improve the adhesion strength. Therefore, by using an insulating film with such a design, the delamination issue between the insulating film and the redistribution layer due to stress induced by CTE (coefficient of thermal expansion) mismatch coming from various materials can be resolved. Furthermore, with the improved adhesion strength, the package structure can sustain bending stress during thermal cycle testing without delamination.

In some embodiments of the present disclosure, a package structure including at least one semiconductor die, an insulating encapsulant, a first redistribution layer, a second redistribution layer, a plurality of antenna elements and a first insulating film is provided. The insulating encapsulant is encapsulating the at least one semiconductor die, the insulating encapsulant has a first surface and a second surface opposite to the first surface. The first redistribution layer is disposed on the first surface of the insulating encapsulant. The second redistribution layer is disposed on the second surface of the insulating encapsulant. The plurality of antenna elements is located over the second redistribution layer. The first insulating film is disposed in between the second redistribution layer and the plurality of antenna elements, wherein the first insulating film comprises a resin rich region and a filler rich region, the resin rich region is located in between the filler rich region and the second redistribution layer and separating the filler rich region from the second redistribution layer.

In some other embodiments of the present disclosure, a package structure including an insulating encapsulant, at least one semiconductor die, a first redistribution layer, a second redistribution layer, a plurality of antenna elements, a first resin layer and a first adhesive layer is provided. The insulating encapsulant has a first surface and a second surface opposite to the first surface. The at least one semiconductor die is embedded within the insulating encapsulant. The first redistribution layer is disposed on the first surface of the insulating encapsulant. The second redistribution layer is disposed on the second surface of the insulating encapsulant. The plurality of antenna elements is located over the second redistribution layer. The first resin layer is disposed in between the second redistribution layer and the plurality of antenna elements, wherein the first resin layer includes fillers. The first adhesive layer is disposed in between the first resin layer and the second redistribution layer, wherein the first adhesive layer and the first resin layer are made of the same resin material.

In yet another embodiment of the present disclosure, a method of fabricating a package structure is described. The method includes the following steps. A bottom redistribution layer is formed on a carrier. At least one semiconductor die is placed on the bottom redistribution layer. An insulating encapsulant is formed to encapsulate the at least one semiconductor die. A top redistribution layer is formed over the insulating encapsulant. The carrier is de-bonded to reveal a backside surface of the bottom redistribution layer. A first insulating film is laminated on the backside surface of the bottom redistribution layer, wherein the first insulating film includes a resin rich region and a filler rich region, the resin rich region is located in between the filler rich region and the bottom redistribution layer and separating the filler rich region from the second redistribution layer. A plurality of antenna elements is provided over the first insulating film.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

providing a resin material having a plurality of fillers dispersed therein, and adding solvents into the resin material to adjust a viscosity of the resin material, and baking and curing the resin material so that the plurality of fillers is clustered on one side of the resin material to define a filler-rich region including the plurality of fillers and a resin-rich region that is substantially filler free;

laminating the resin material on a redistribution layer, wherein the resin material is attached to the redistribution layer through the resin-rich region; and forming a plurality of antenna patterns on the filler-rich region of the resin material.

2. The method according to claim 1, wherein after the baking and curing of the resin material, a ratio of a thickness of the filler-rich region to a thickness of the resin-rich region is in a range of 1:75 to 1:360.

3. The method according to claim 1, wherein the viscosity of the resin material is adjusted to 3000 cP or less.

4. The method according to claim 3, wherein the viscosity of the resin material is adjusted to a range of 10 cP to 500 cP.

5. The method according to claim 1, wherein after laminating the resin material on the redistribution layer, the resin material is further cured at a temperature range of 150° C. to 180° C.

6. The method according to claim 1, further comprising: laminating a second resin material on the resin material prior to forming the plurality of antenna patterns, wherein the second resin material includes a second filler-rich region including a plurality of second fillers and a second resin-rich region that is substantially filler free.

7. The method according to claim 1, wherein the plurality of fillers includes silica particles or $Al_2O_3$ particles.

8. A method, comprising:
providing a semiconductor die;
forming through insulator vias surrounding the semiconductor die;
forming an insulating encapsulant encapsulating the semiconductor die and the through insulator vias;
forming an insulating film over the insulating encapsulant, wherein the insulating film is formed by dispersing fillers into a resin material and adjusting the viscosity of the resin material to 3000 cP or less; and
forming antenna patterns on the insulating film, wherein the antenna patterns are overlapped with the through insulator vias.

9. The method according to claim 8, wherein the insulating film is formed by dispersing the fillers into the resin material and adjusting the viscosity of the resin material to a range of 10 cP to 500 cP.

10. The method according to claim 8, further comprising;
forming a first redistribution layer and a second redistribution layer on two opposing sides of the insulating encapsulant, wherein the insulating film is adhered onto the first redistribution layer through the resin material.

11. The method according to claim 8, wherein after adjusting the viscosity of the resin material to 3000 cP or less, a first layer including the fillers and a second layer that is substantially filler free is formed in the insulating film.

12. The method according to claim 11, wherein a content of the fillers located in the first layer is more than 80% by weight based on a total weight of the insulating film.

13. The method according to claim 11, wherein an interface is formed between the first layer and the second layer, and the interface is an uneven interface.

14. The method according to claim 8, further comprises laminating a second insulating film on the insulating film prior to forming the antenna patterns, wherein the second insulating film includes second fillers dispersed in a second resin material.

15. A method, comprising:
forming package structure components over a substrate; and
forming an insulating film over a dielectric layer surface of the package structure components, wherein the insulating film is formed with a resin-rich region and a filler-rich region, the resin-rich region is attached to the dielectric layer surface, and a ratio of a thickness of the resin-rich region to a thickness of the filler-rich region is in a range of 1:75 to 1:360.

16. The method according to claim 15, wherein forming the package structure components comprises:
forming a first redistribution layer on the substrate, wherein the first redistribution layer includes the dielectric layer surface;
forming a semiconductor die on the first redistribution layer; and
forming a second redistribution layer on the semiconductor die and electrically connected to the semiconductor die.

17. The method according to claim 15, wherein a content of fillers located in the filler-rich region is more than 80% by weight based on a total weight of the insulating film, and the content of fillers located in the resin-rich region is less than 10% by weight based on the total weight of the insulating film.

18. The method according to claim 15, wherein the insulating film with the resin-rich region and a filler-rich region is formed by dispersing fillers into a resin material and adjusting the viscosity of the resin material to a range of 10 cP to 500 cP.

19. The method according to claim 18, wherein the viscosity of the resin material is adjusted by adding solvents or diluents into the resin material.

20. The method according to claim 15, further comprises forming a second insulating film over the insulating film, wherein the second insulating film is formed with a second resin-rich region and a second filler-rich region, the second resin-rich region is sandwiched between the second filler-rich region and the filler-rich region of the insulating film, and a ratio of a thickness of the second resin-rich region to a thickness of the second filler-rich region is in a range of 1:75 to 1:360.

* * * * *